(12) United States Patent
Liu et al.

(10) Patent No.: US 9,711,539 B2
(45) Date of Patent: Jul. 18, 2017

(54) ARRAY SUBSTRATE AND METHOD OF FABRICATING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chong Liu, Beijing (CN); Haisheng Zhao, Beijing (CN); Haitao Ma, Beijing (CN); Hongxi Xiao, Beijing (CN); Zhilong Peng, Beijing (CN); Huanping Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/802,668

(22) Filed: Jul. 17, 2015

(65) Prior Publication Data

US 2016/0126261 A1 May 5, 2016

(30) Foreign Application Priority Data

Oct. 31, 2014 (CN) .......................... 2014 1 0601808

(51) Int. Cl.
*H01L 27/12* (2006.01)

(52) U.S. Cl.
CPC ................................ *H01L 27/1244* (2013.01)

(58) Field of Classification Search
CPC ............... H01L 27/3244; H01L 27/326; H01L 27/3248; H01L 27/3281
See application file for complete search history.

(56) References Cited

U.S. PATENT DOCUMENTS

| 6,429,909 B1 | 8/2002 | Kim et al. |
| 2004/0016925 A1 | 1/2004 | Watamura |

(Continued)

FOREIGN PATENT DOCUMENTS

| CN | 101174067 A | 5/2008 |
| CN | 101226901 A | 7/2008 |

(Continued)

OTHER PUBLICATIONS

1st office action issued in corresponding Chinese application No. 201410601808.5 dated Aug. 1, 2016.

(Continued)

*Primary Examiner* — Cuong Q Nguyen
(74) *Attorney, Agent, or Firm* — Nath, Goldberg & Meyer; Joshua B. Goldberg

(57) ABSTRACT

The present invention provides an array substrate, a method of fabricating the array substrate, and a display device. The method of fabricating the array substrate of the present invention comprises steps of: sequentially forming a first transparent conductive film and a source-drain metal film on a substrate; forming a source-drain metal pattern by performing a patterning process on the source-drain metal film; forming a pattern comprising a pixel electrode and a compensation structure that is provided below the source-drain metal pattern by performing a patterning process on the first transparent conductive film.

12 Claims, 1 Drawing Sheet

(56) References Cited

U.S. PATENT DOCUMENTS

2008/0142797 A1* 6/2008 Lee .................... H01L 27/1214
   257/43
2009/0091675 A1* 4/2009 Park ................. G02F 1/134309
   349/43

FOREIGN PATENT DOCUMENTS

| CN | 101236953 A | 8/2008 |
| CN | 102623460 A | 8/2012 |
| CN | 102651401 A | 8/2012 |

OTHER PUBLICATIONS

Chinese office action dated Feb. 7, 2017 for CN application No. 201410601808.5 with English translation attached.

* cited by examiner

ARRAY SUBSTRATE AND METHOD OF FABRICATING THE SAME, AND DISPLAY DEVICE

FIELD OF THE INVENTION

The present invention relates to the field of display technology, and particularly to a method of fabricating an array substrate, the array substrate, and a display device.

BACKGROUND OF THE INVENTION

With development of display technology and people's ever-increasing requirement for display image quality, the demand for a flat-panel display device with a high image quality and a high resolution has become increasingly common, and attracted more and more attention from manufacturer of display panels.

An array substrate is an important part of a display device, and the array substrate generally includes a thin film transistor, a pixel electrode, a common electrode and the like. Various elements on the array substrate are formed by adopting a patterning process during fabrication of the array substrate. The patterning process generally includes: exposing, developing, etching and stripping. The etching process includes wet etching and dry etching, which are used for patterning a metal film.

As shown in FIG. 1, in the prior art, a method of fabricating an array substrate is provided, and includes: sequentially forming a gate 1, a gate insulation layer, an active layer 2, a pixel electrode 3, a source 4-1 and a drain 4-2 on a substrate, a gate line 10 is generally formed while the gate electrode 1 is formed, and a data line 40 is formed while the source 4-1 and the drain 4-2 are formed.

The inventor has found that at least the following problems exist in the prior art: patterns of the gate 1, the active layer 2, the pixel electrode 3 and the like have already been formed on the substrate before the source 4-1, the drain 4-2 and the data line 40 are formed, such that the surface of the formed source-drain metal film is uneven and has height differences, and thus breakage is liable to occur when the patterns of the source 4-1, the drain 4-2, the data line 40 and the like are formed by wet etching, thereby resulting in failure of the array substrate.

SUMMARY OF THE INVENTION

In view of the above-mentioned problems in the existing method of fabricating the array substrate, an object of the present invention is to provide a method of fabricating an array substrate, an array substrate, and a display device, which can avoid failure of the array substrate caused by breakage of a source-drain metal pattern.

An embodiment of the present invention provides a method of fabricating an array substrate, comprising steps of: sequentially forming a first transparent conductive film and a source-drain metal film on a substrate; forming a source-drain metal pattern by performing a patterning process on the source-drain metal film; and forming a pattern comprising a pixel electrode and a compensation structure that is provided below the source-drain metal pattern by performing a patterning process on the first transparent conductive film.

In the method, when the source-drain metal pattern is formed through wet etching, breakage of the metal layer is liable to occur at the turning point of the source-drain metal pattern due to process factors, and the compensation structure located below the source-drain metal pattern is used to compensate for the breakage of the metal layer and keep the electrical connection. Furthermore, the compensation structure located below the source-drain metal pattern is formed while the pixel electrode is formed, and when the compensation structure is formed, the source-drain metal pattern has already been formed. That is, the source-drain metal pattern is equivalent to a mask plate for forming the compensation structure. Therefore, the formed compensation structure is aligned with the source-drain metal pattern more precisely, such that the applicability of the method is superior.

The source-drain metal pattern may include at least a source, a drain and a data line.

Before forming the first transparent conductive film, the method may further comprise steps of: forming a gate metal pattern through a patterning process; forming a gate insulation layer; and forming a pattern comprising an active layer through a patterning process.

While the active layer is formed, an ohmic contact pattern layer may further be formed to cover the active layer.

After the pattern comprising the pixel electrode and the compensation structure is formed, the method may further comprise steps of: removing the ohmic contact pattern provided between the source and the drain and provided above the active region of the active layer through dry etching, so as to form an ohmic contact layer, the source and the drain are electrically connected to the active layer through the ohmic contact layer respectively.

After the ohmic contact layer is formed, the method may further comprise steps of: forming a planarization layer; and forming a pattern comprising a common electrode through a patterning process.

The gate metal pattern may include at least a gate, a gate line and a gate metal connecting line.

Another embodiment of the present invention provides an array substrate which is fabricated through the aforementioned method. The array substrate comprises: a pixel electrode and a compensation structure provided in the same layer above a substrate, the compensation structure comprising transparent conductive material; and a source-drain metal pattern provided on the compensation structure.

The source-drain metal pattern may comprise at least a source, a drain, and a data line.

Between the substrate and the pixel electrode, the array substrate may further comprise: a gate metal pattern provided above the substrate; a gate insulation layer provided on the gate metal pattern; and an active layer provided on the gate insulation layer.

The array substrate may further comprise an ohmic contact layer provided on the active layer, the source and the drain are electrically connected to the active layer through the ohmic contact layer, respectively.

The array substrate may further comprise: a planarization layer; and a common electrode provided on the planarization layer.

The gate metal pattern may comprise at least a gate, a gate line, and a gate metal connecting line.

A further embodiment of the present invention provides a display device which includes the aforementioned array substrate.

DETAILED DESCRIPTION OF THE INVENTION

To make those skilled in the art more readily understand the technical solutions of the present invention, a further detailed description of the present invention is given below in conjunction with the accompanying drawings and specific embodiments.

According to an embodiment of the present invention, a method of fabricating an array substrate is provided, which includes the following steps of: sequentially forming a first transparent conductive film and a source-drain metal film on a substrate; forming a source-drain metal pattern by performing a patterning process on the source-drain metal film, wherein the source-drain metal pattern may include a source, a drain, and a data line; and forming a pattern comprising a pixel electrode and a compensation structure that is located below the source-drain metal pattern by performing a patterning process on the first transparent conductive film.

In the present invention, the patterning process may only include a lithography process, or may include a lithography process and an etching step, or may include other processes for forming predetermined patterns, such as printing and ink-jetting. The lithography process refers to a process which forms a pattern by means of a photoresist, a mask plate, an exposure machine and the like, including process steps such as film forming, exposing and developing. A corresponding patterning process can by selected according to the formed structure of the present invention.

Figure 1:
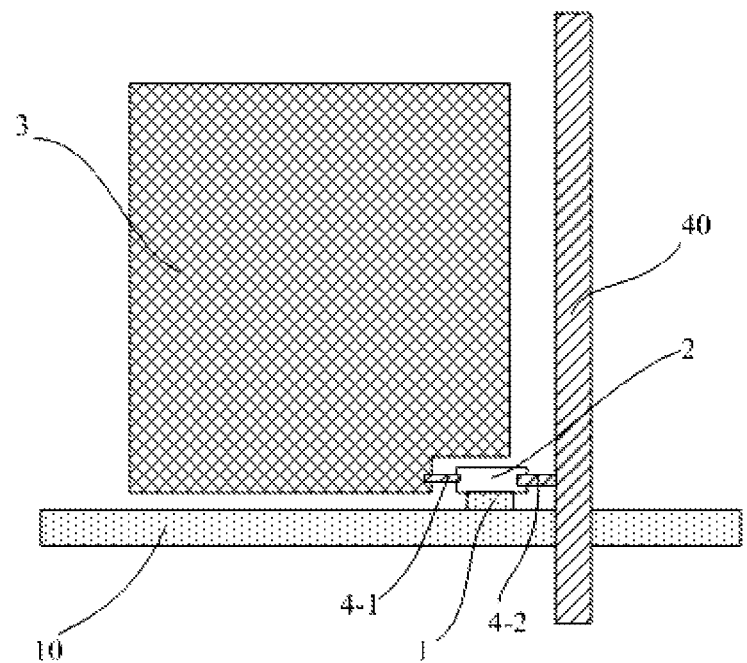
FIG. 1 is a schematic diagram of a partial structure of an existing array substrate.
Figure 2:
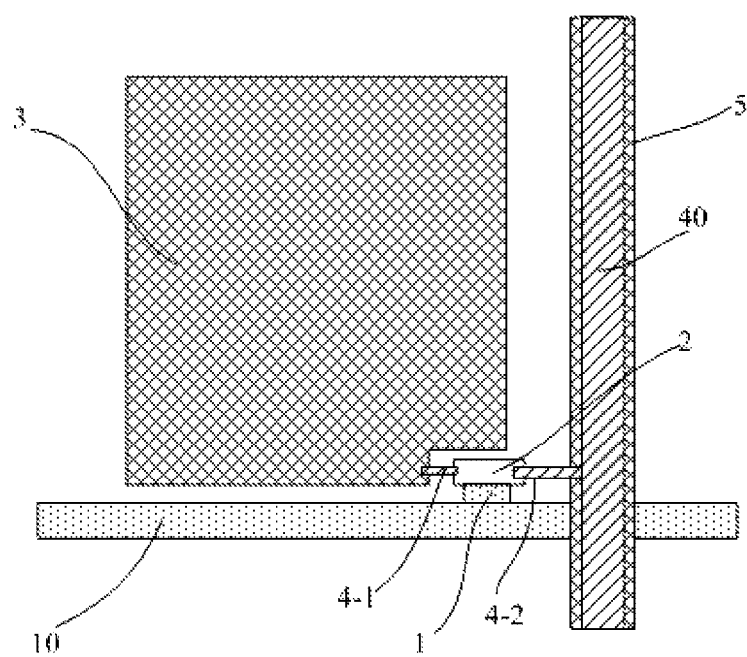
FIG. 2 is a schematic diagram of a partial structure of an array substrate of an embodiment of the present invention.

Specifically, as shown in FIG. 2, the method of an array substrate provided by this embodiment specifically comprises the first to sixth steps as follows.

In the first step, a gate metal film is formed on a substrate, and a pattern comprising a gate 1, a gate line 10 and a gate metal connecting line is formed through a patterning process.

In this step, the substrate is made of a transparent material and is pre-cleaned. Specifically, the gate metal film is formed on the substrate through sputtering, thermal evaporation, plasma enhanced chemical vapor deposition (PECVD), low pressure chemical vapor deposition (LPCVD), atmospheric pressure chemical vapor deposition (APCVD) or electron cyclotron resonance chemical vapor deposition (ECR-CVD). The gate metal film is made of metal, metal alloy or the like, such as molybdenum, molybdenum-niobium alloy, aluminum, aluminum-neodymium alloy, titanium or copper. Then, the pattern comprising the gate 1, the gate line 10 and the gate metal connecting line is formed through a first patterning process (which may comprise film forming, exposing, developing, and wet or dry etching).

In the second step, a gate insulation layer is formed on the substrate subjected to the aforementioned steps, through PECVD, LPCVD, APCVD, ECR-CVD, or sputtering.

In the third step, a pattern comprising an active layer 2 is formed on the substrate subjected to the aforementioned steps, through a patterning process.

In this step, specifically, an amorphous silicon (a-Si) film and an n+ amorphous silicon (n+a-Si) film are sequentially formed on the gate insulation layer through deposition, the deposition includes PECVD and LPCVD. Subsequently, a pattern of the active layer 2 and an ohmic contact pattern are formed through a patterning process. That is, a photoresist layer is formed on the n+ amorphous silicon (n+a-Si) film, the photoresist layer is exposed and developed, and then the amorphous silicon (a-Si) film and the n+ amorphous silicon (n+a-Si) film are dry-etched, so as to form the pattern of the active layer 2 and the ohmic contact pattern.

In the fourth step, a first transparent conductive film and a source-drain metal film are sequentially formed on the substrate subjected to the aforementioned steps, through PECVD, LPCVD, APCVD, ECR-CVD, or sputtering, and then a source-drain metal pattern comprising a source 4-1, a drain 4-2 and a data line 40 is first formed by performing a patterning process (exposing, developing, and wet etching) on the source-drain metal film, and a pattern comprising the pixel electrode 3 and the compensation structure 5 that is located below the source-drain metal pattern is then formed by performing a patterning process (exposing, developing, and wet etching) on the first transparent conductive film. Finally, the ohmic contact pattern located between the source electrode 4-1 and the drain electrode 4-2 and located above the active region of the active layer 2 is dry-etched to obtain an ohmic contact layer. The source electrode 4-1 and the drain electrode 4-2 are electrically connected to the active layer 2 through the ohmic contact layer, respectively.

It should be understood that, in FIG. 2, the compensation structures located below the source 4-1 and the drain 4-2 are not shown, and only the compensation structure 5 located below the data line 40 is schematically illustrated.

In the fifth step, a planarization layer is formed on the substrate subjected to the aforementioned steps, through PECVD, LPCVD, APCVD, ECR-CVD or sputtering.

In the sixth step, a second transparent conductive film is formed on the substrate subjected to the aforementioned steps, through sputtering, thermal evaporation, PECVD, LPCVD, APCVD or ECR-CVD, and a pattern comprising the common electrode is formed through a patterning process (exposing, developing, and wet etching).

To this point, the fabrication of the array substrate is completed, and during forming of the source-drain metal pattern through wet etching, due to process factors (i.e., the metal layer of the source-drain metal pattern is uneven as a result of a device structure already formed below the source-drain metal pattern), breakage of the metal layer is liable to occur at the turning point of the source-drain metal pattern, and the compensation structures 5 located below the source-drain metal pattern are used to compensate for the breakage position of the metal layer and keep the electrical connection.

Furthermore, in this embodiment, the compensation structures 5 located below the source-drain metal pattern are formed while the pixel electrode 3 is formed. When the compensation structure 5 is formed, the source-drain metal pattern has already been formed. That is, the source-drain metal pattern is equivalent to a mask plate for forming the compensation structure 5. Therefore, the formed compensation structure 5 is aligned with the source-drain metal pattern more precisely, such that the applicability of the method is superior.

Accordingly, the present invention further provides an array substrate which is fabricated through the aforementioned method.

Another embodiment of the present invention provides a display device which includes the array substrate in the aforementioned embodiment.

The display device may be a liquid crystal display device or an electroluminescent display device, for example, any product or component having a display function, such as a liquid crystal panel, an electronic paper, an OLED panel, a mobile phone, a tablet PC, a TV, a display, a notebook computer, a digital photo frame, a navigator.

The display device in the embodiment has a relatively good display quality.

It should be understood that the aforesaid embodiments are only exemplary embodiments used for illustrating the principle of the present invention, but the present invention is not limited thereto. Various modifications and improvements can be made by those of ordinary skill in the art without departing from the spirit and essence of the present invention, and these modifications and improvements should also be considered as falling within the protection scope of the present invention.

The invention claimed is:

1. An array substrate, comprising:
   a pixel electrode and a compensation structure provided in the same layer above a substrate, the compensation structure comprising transparent conductive material; and
   a source-drain metal pattern provided on the compensation structure;
   wherein the compensation structure is configured to compensate for a height difference at a turning point of the source-drain metal pattern.

2. The array substrate of claim 1, wherein the source-drain metal pattern comprises at least a source, a drain, and a data line.

3. The array substrate of claim 2, wherein between the substrate and the pixel electrode, the array substrate further comprises:
   a gate metal pattern provided above the substrate;
   a gate insulation layer provided on the gate metal pattern; and
   an active layer provided on the gate insulation layer.

4. The array substrate of claim 3, further comprising an ohmic contact layer provided on the active layer and between the source and the drain, wherein the source and the drain are electrically connected to the active layer through the ohmic contact layer, respectively.

5. The array substrate of claim 4, further comprising:
   a planarization layer; and
   a common electrode provided on the planarization layer.

6. The array substrate of claim 3, wherein the gate metal pattern comprises at least a gate, a gate line, and a gate metal connecting line.

7. A display device, comprising an array substrate, the array substrate comprising:
   a pixel electrode and a compensation structure provided in the same layer above a substrate, the compensation structure comprising transparent conductive material; and
   a source-drain metal pattern provided on the compensation structure;
   wherein the compensation structure is configured to compensate for a height difference at a turning point of the source-drain metal pattern.

8. The display device of claim 7, wherein the source-drain metal pattern comprises at least a source, a drain, and a data line.

9. The display device of claim 8, wherein between the substrate and the pixel electrode, the array substrate further comprises:
   a gate metal pattern provided above the substrate;
   a gate insulation layer provided on the gate metal pattern; and
   an active layer provided on the gate insulation layer.

10. The display device of claim 9, further comprising an ohmic contact layer provided on the active layer and between the source and the drain, wherein the source and the drain are electrically connected to the active layer through the ohmic contact layer, respectively.

11. The display device of claim 10, further comprising:
    a planarization layer; and
    a common electrode provided on the planarization layer.

12. The display device of claim 9, wherein the gate metal pattern comprises at least a gate, a gate line, and a gate metal connecting line.

* * * * *